(12) United States Patent
Lam

(10) Patent No.: US 8,994,448 B2
(45) Date of Patent: Mar. 31, 2015

(54) SYSTEMS AND METHODS FOR GENERATION OF INTERNAL CHIP SUPPLY BIAS FROM HIGH VOLTAGE CONTROL LINE INPUTS

(71) Applicant: Peregrine Semiconductor Corporation, San Diego, CA (US)

(72) Inventor: Fleming Lam, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/853,944

(22) Filed: Mar. 29, 2013

(65) Prior Publication Data
US 2014/0292398 A1    Oct. 2, 2014

(51) Int. Cl.
| G05F 1/10 | (2006.01) |
| G05F 3/02 | (2006.01) |
| H03K 17/06 | (2006.01) |
| G05F 1/46 | (2006.01) |

(52) U.S. Cl.
CPC ............... *H03K 17/063* (2013.01); *G05F 1/46* (2013.01)

USPC ............ 327/541; 327/540; 327/543; 327/539

(58) Field of Classification Search
USPC ........... 327/530–546, 365–508; 323/312–317
See application file for complete search history.

(56) References Cited

U.S. PATENT DOCUMENTS

| 6,066,974 | A  | * | 5/2000  | Lin et al. ........................ 327/320 |
| 6,794,916 | B1 | * | 9/2004  | Varma ............................ 327/218 |
| 6,803,680 | B2 | * | 10/2004 | Brindle et al. ................. 307/115 |
| 2006/0001473 | A1 | * | 1/2006 | Yasuda et al. ................. 327/415 |
| 2007/0013432 | A1 | * | 1/2007 | Miyazawa .................... 327/404 |
| 2007/0139094 | A1 | * | 6/2007 | Nakatsuka et al. ........... 327/430 |
| 2009/0096508 | A1 | * | 4/2009 | Sohara et al. ................. 327/536 |
| 2011/0025408 | A1 | * | 2/2011 | Cassia et al. ................. 327/535 |

* cited by examiner

*Primary Examiner* — Brandon S Cole

(74) *Attorney, Agent, or Firm* — Jaquez Land Richman LLP; Martin J. Jaquez, Esq.; Alessandro Steinfl, Esq.

(57) ABSTRACT

Systems and methods for generating internal chip supply bias from high voltage control line inputs are presented. One of a plurality of the high voltage control lines is selected and accordingly internal path switching circuitry is enabled to pass the selected high voltage control line while protecting the associated components from over-stress.

10 Claims, 3 Drawing Sheets

SYSTEMS AND METHODS FOR GENERATION OF INTERNAL CHIP SUPPLY BIAS FROM HIGH VOLTAGE CONTROL LINE INPUTS

BACKGROUND

1. Field

The present teachings relate to power supplies in integrated devices. More particularly, the present teachings relate to systems and methods for generation of internal chip supply bias voltage from high voltage control line inputs.

2. Description of Related Art

In low voltage semiconductor technology such as silicon on sapphire (SOS) or silicon on insulator (SOI), typical transistors can only withstand a limited voltage across their terminals before experiencing reliability issues. Typical maximum voltages are in the range of high 2 to mid 3 volt range. This limitation poses a challenge when trying to generate an internal chip supply bias from high voltage control line inputs which can reach levels as high as 5.5 volts without a dedicated supply pin.

SUMMARY

The present disclosure overcomes the above problems by providing an internal chip supply bias from high voltage control line inputs in the absence of a dedicated chip supply pin without over stressing internal devices with voltages beyond the technology limit.

In particular, according to a first aspect of the disclosure, an integrated circuit is presented, the integrated circuit comprising: an internal integrated circuit supply node; a plurality of individually selectively activatable transistor arrangements inclusive of pass transistors for selectively passing respective input control voltages to the internal integrated circuit supply node in order to supply power to the integrated circuit; and a corresponding plurality of individually controllable biasing arrangements for biasing respective pass transistors of the transistor arrangements, the biasing arrangement being configured to prevent voltage over-stress of the biased pass transistors.

According to a second aspect of the disclosure, a method for bootstrapping an internal chip supply is presented, the method comprising: providing an internal supply node configured to supply the internal chip supply; providing a plurality of selectable input control voltages; providing a plurality of transistor arrangements comprising stacked pass transistors each transistor arrangement configured to selectively pass a selectable input control voltage of the plurality of selectable input control voltages and connect said input control voltage to the internal supply node; selecting an input control voltage; based on the selecting, biasing the stacked pass transistors of the plurality of transistor arrangements; based on the biasing, protecting the stacked pass transistors of the plurality of transistor arrangements from overstressing; based on the biasing, selecting a transistor arrangement and passing the input control voltage; based on the passing, providing a supply voltage to the internal supply node; based on the providing the supply voltage, bootstrapping the internal chip supply.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Embodiments of the present disclosure are directed to systems and methods to generate an internal integrated circuit (also called chip throughout the present disclosure) supply bias from high voltage control line inputs in the absence of a dedicated chip supply pin without over stressing internal devices with voltages beyond the technology limit.

Figure 1:
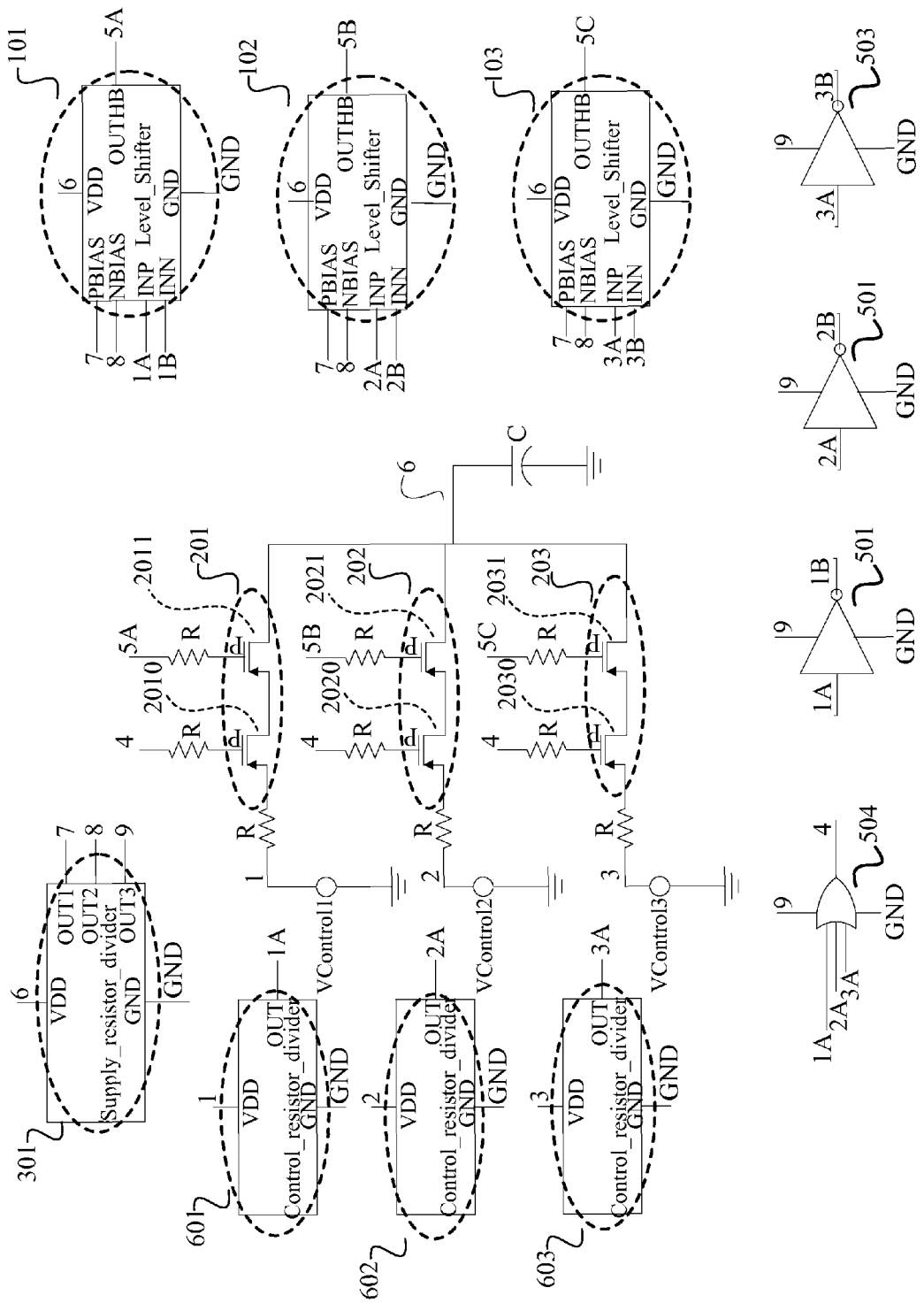
FIG. 1 shows an example embodiment according to the present disclosure of the various circuits used to generating an internal chip supply bias from high voltage control line inputs.

Referring to FIG. 1, this is accomplished by selectively passing one of a plurality (e.g., three) of input control voltages VControl1, VControl2 and VControl3 applied at a respective plurality of nodes (1, 2 and 3) through series stacked pass transistor structures (201, 202 and 203) in as the internal chip supply at node (6). As shown in the middle portion of FIG. 1, each series stacked pass transistor structure comprises a plurality (e.g. 2) of cascode-arranged PMOS transistors (2010, 2011; 2020, 2021; and 2030, 2031).

By way of example, the effective on-chip supply at node (6) can be used to power a voltage regulator for providing power to the rest of the chip. In the embodiment of FIG. 1, it is assumed that there are three control inputs or nodes (1, 2, 3) which provide the input control voltages. The person skilled in the art will however understand that the implementation can be expanded to multiple control line inputs.

Additionally, a control logic for the chip is provided (not shown), to define one of the three control lines to be set at logic high at any given time and serve as the supply to the internal chip.

In the embodiment of FIG. 1, each series stacked pass transistor structure (201, 202, 203) comprises a respective stack of two pass transistors (2010, 2011; 2020, 2021; 2030, 2031) to safely handle the upper control input level of 5.5 V. In order to pass in the control lines through the pass transistors, the gates of each pass transistor device are biased in such a manner that the control line input path set to logic high gets passed in while at the same time not over-stressing the pass transistors with voltages beyond the technology reliability limit. This is accomplished by constraining the gate bias voltage of the pass transistors to levels which would not over-stress the pass transistors.

By way of example, as shown in the embodiment of FIG. 1, the stacked pass transistor structures (201, 202, and 203) are comprised of PMOS transistors in order to allow the supply biasing scheme to bootstrap during power-up. With the initial application of a control line input at nodes (1, 2 or 3), the PMOS devices will enable the control line input being set to logic high to begin to be passed in as the PMOS devices will begin to conduct current with their gates initially at 0 V. This in turn will begin to charge up node (6) which is the internal chip supply. As node (6) begins to ramp up in voltage, node (6) will power level shifter circuitry (101, 102 and 103), which in turn, the level shifter output is used to bias the stacked pass transistor structures (201, 202 and 203).

Figure 2:
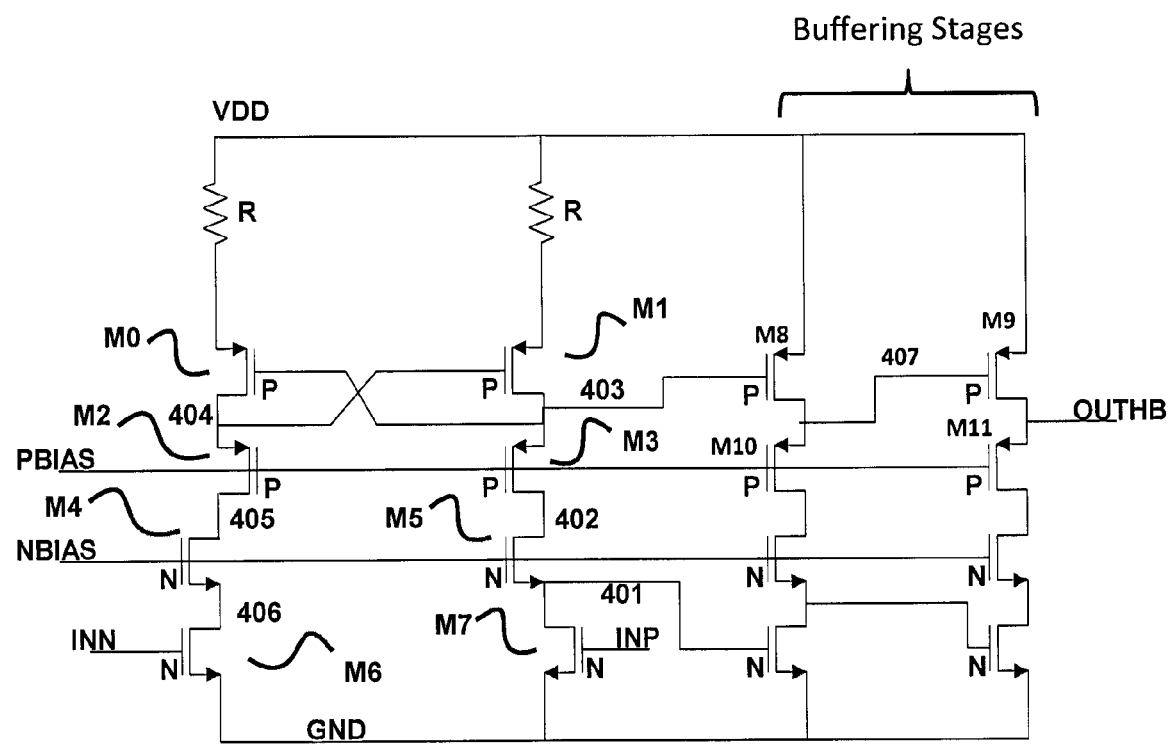
FIG. 2 shows a detailed schematic according to an embodiment of the present disclosure of the level shifter circuit (101, 102, 103) of FIG. 1.

FIG. 2 shows an exemplary embodiment of the level shifter circuitry. In particular, FIG. 2 shows a level shifting circuitry with constrained output level which generates the gate bias voltages to the second PMOS transistor (2011, 2021 and 2031) of each cascode-arranged pass transistor shown as nodes (5A), (5B) and (5C) in the pictorial representation of FIG. 1.

Properly biasing of second transistors (2011, 2021 and 2031) or, more generally, of the pass transistors directly connected to node (6) in case each plurality of pass transistors contains more than two pass transistors, will allow a proper functioning of the circuit without over-stressing any of the transistors in the supply path. For an "OFF" path corresponding to a control line input set at logic low, the gate bias to the second device should reside near the internal chip supply voltage set at node (6) in order to ensure that the path through the second pass transistor is not conducting. However, for the selected "ON" path corresponding to the control input set at logic high, the gate bias to the second transistor cannot reside at or near 0V or the pass transistor would be voltage over-stressed in the event of a high control logic level such as 5.5V.

One way to overcome this is to bias the gate of the second transistor for an "ON" pass transistor path with a constrained voltage that does not drop too low in voltage to present an over-voltage condition (e.g. across terminals of a pass transistor) but is still low enough to ensure a conductive path to pass in the logic high control input (e.g. gate transistors ON).

The level shifter circuitry shown in FIG. 2 accomplishes this by generating output voltage levels which are constrained to be near node PBIAS for a logic low output at node OUTHB while reaching logic levels equal to the internal chip supply voltage set at node (6) for logic high output. Since supply to the level shifter elements (101, 102, and 103) is derived from the internal chip supply voltage set at node (6), this allows for a bootstrapped operation.

Furthermore, input controls to the level shifter circuitry are configured to generate a logic high for an OFF path and a logic low for a selected ON path at the output node OUTHB. These controls are input at nodes labeled "INP" and "INN" of the level shifter and are derived from the input control voltages (VControl1, VControl2, VControl3) through the control resistor dividers (501, 502, 503) represented in FIG. 1 and FIG. 4 as described later in this disclosure.

In particular, to better understand the operation of the level shifter circuitry shown in FIG. 2, reference is made to the case where node INP transitions from logic low to high which corresponds to transition of an input control from a logic low to a logic high. Since INN is the complement of INP, as node INP goes from logic low to logic high, node INN goes from logic high to logic low. The positive voltage swing of INP at the gate of the transistor M7 turns transistor M7 on, which in turn will pull nodes (401, 402, and 403) to a lower voltage. As node (403) drops, transistor M0 will begin to conduct. Meanwhile, transistor M6 is being turned off as node INN connected to the gate of transistor M6 goes low. Hence, nodes (404, 405, and 406) are being charged up as the current through transistor M6 reduces.

As node (404) is being charged up, it will begin to turn transistor M1 off so node (403) will continue to drop at a faster rate. This in turn will turn transistor M0 on harder as node (403) is connected to the gate of transistor M0. This mechanism constitutes a positive feedback loop. The implication is that the input levels at the nodes INN & INP of the circuit in FIG. 2 do not need to be at the full level of the VDD (e.g. control input) to get the transistors to switch states. That is, a logic high does not need to be at a voltage level of VDD to be interpreted as a logic high. It simply needs to be slightly above the threshold voltage of transistors 406 or 407.

The steady state value at node (406) is determined by the operating condition whereby the sub-threshold current of M4 is equal to the leakage current of the off transistor M6. This value will be near the voltage set at node NBIAS. In this case, nodes (404 and 405) will rest at VDD, and transistors M0 & M2 will be in the triode region.

The steady state value at node (403) is determined by the operating condition whereby the sub-threshold current of M3 is equal to the leakage current of the off transistor M1. This value will be near the voltage set at node PBIAS. Nodes (403 and 401) are further buffered via stacked stages, as indicated in FIG. 2, which rely on the middle devices biased by the voltage set by the PBIAS & NBIAS nodes.

The output stage consists of two cascaded stages of stacked transistors biased in a similar fashion to the level shifter core. The output of transistor M1 (node 403) drives the gate of transistor M8. For the case of a conduction path enabled (ON path), node 403 will reside near the voltage set at the node PBIAS. This will cause transistor M8 to conduct and charge node 407 up to VDD. This will in turn cause transistor M9 to be off. The final value of the node OUTHB will be determined by the operating condition whereby the sub-threshold current of M11 is equal to the leakage current of the off device M9. This value will be near the voltage set at node PBIAS. Conversely, for a conduction path disabled (OFF path), the opposite occurs as node 403 will reside near VDD. This will turn transistor M8 off. The voltage at node 407 will reside near the voltage set at PBIAS as the off leakage current of M8 must equal the sub-threshold current of M10. This will turn on transistor M9 which drives the node OUTHB to a value of VDD for the case of a conduction path disabled.

Figure 3:
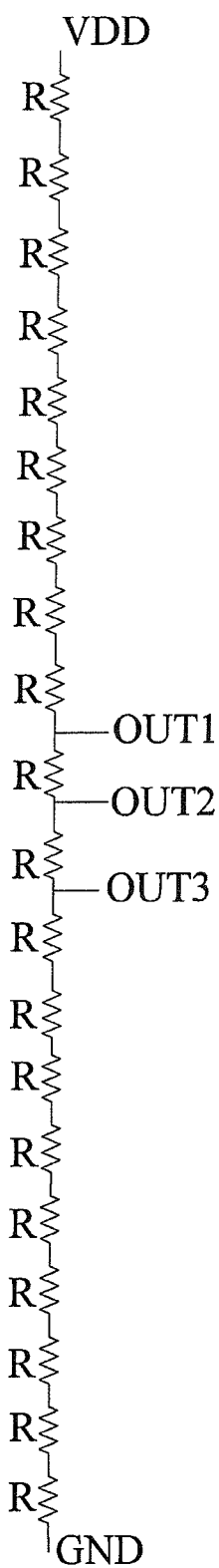
FIG. 3 and FIG. 4, show detailed schematic according to an embodiment of the present disclosure of the supply_resistor divider (301) and the control_resisitor_divider (601, 602, 603) circuits of FIG. 1.

The bias voltages PBIAS and NBIAS can be derived from a supply resistor divider network (301) operating between the internal chip supply set at node (6) & ground as shown in FIG. 3, and as such cannot be greater than the chip supply at node (6).

In accordance with the present disclosure, the resistor ratio used in the supply resistor divider network (301) determining the voltage levels of PBIAS and NBIAS is chosen to limit the output from the level shifter circuit such that the output does not over-stress the pass transistors. By having the voltages at nodes PBIAS & NBIAS bootstrapped to the internal chip supply set at node (6), the level shifter output OUTHB can adjust with changing values to the logic high level of the control line input. The net result is a constrained output level to drive the second transistor (2011, 2021 and 2031) of the stacked pass transistors with an appropriate level. As such, for the case of a logic high input control, the effective output voltage level from the level shifter is constrained to be near PBIAS. For a logic low input control, the effective output voltage is at VDD.

Figure 4:
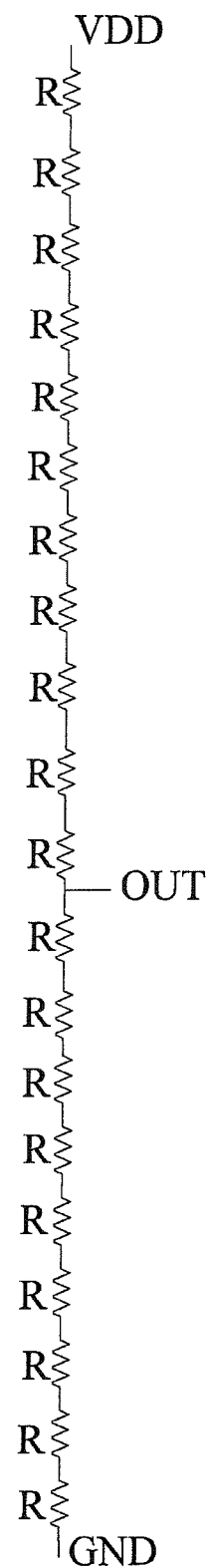

Since the level shifter circuitry shown in FIG. 2 does not require full rail signal amplitude inputs to operate due to its positive feedback nature of operation, the inputs INP and INN can be operated with smaller amplitude versions of the control line input. To this end, control line resistor divider networks (601, 602, and 603) as shown in FIG. 1 and FIG. 4 are used to generate logic levels at inputs nodes (1A, 2A and 3A) (INP) of the level shifter circuitry, whereas the supply resistor divider network (301) shown in FIG. 1 and FIG. 3 is used to generate a reduced low voltage at node (9) which is used to safely power logic gates (501, 502, and 503) which generate the complementary logic levels set at nodes (1B, 2B, and 3B) (INN) of the level shifter input. The supply resistor divider network (301) is also used to power logic gate (504) whose output is used to bias the gate voltage of the first transistor of the stacked pass transistors at a safe voltage level without voltage over-stress.

Therefore, in accordance with the present disclosure, biasing systems and methods are provided, which allow generating an internal chip supply without a dedicated supply pin from high voltage control line inputs in a safe fashion without over-stressing devices with voltages beyond the technology limit.

The person skilled in the art will be able to extend the teachings of the present disclosure to any type of IC with single or multiple power sources in a manner similar to what has already been discussed in the present disclosure. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

The invention claimed is:

1. An integrated circuit comprising:
an internal integrated circuit supply node;
a charging capacitor connected to the internal integrated circuit supply node;
a plurality of individually selectively activatable transistor arrangements inclusive of pass transistors for selectively passing respective input control voltages to the internal integrated circuit supply node in order to supply power to the integrated circuit; and
a corresponding plurality of individually controllable biasing arrangements for biasing respective pass transistors of the transistor arrangements, the biasing arrangement being configured to prevent voltage over-stress of the biased pass transistors,
wherein power to the integrated circuit is configured to be supplied via a voltage at the charging capacitor, wherein each transistor arrangement comprises a plurality of cascode-arranged pass transistors, and wherein a gate bias voltage provided to a gate of a pass transistor of the plurality of cascode-arranged pass transistors directly connected to the internal integrated circuit supply node is configured to be constrained between a voltage of a control signal and the voltage at the charging capacitor.

2. The integrated circuit of claim 1, wherein the gate bias voltage adjusts with changing values of the input control voltage.

3. The integrated circuit of claim 2, wherein the gate bias voltage is constrained to levels which do not over-stress the plurality of cascode-arranged pass transistors.

4. The integrated circuit of claim 1, wherein each pass transistor of the plurality of cascode-arranged pass transistors is a PMOS transistor.

5. The integrated circuit of claim 2, wherein a level of a gate bias voltage provided to each pass transistor of the plurality of cascode-arranged pass transistors not directly connected to the internal integrated circuit supply node is independent from the input control voltage.

6. An integrated circuit comprising:
an internal integrated circuit supply node;
a charging capacitor connected to the internal integrated circuit supply node;
a plurality of individually selectively activatable transistor arrangements inclusive of pass transistors for selectively passing respective input control voltages to the internal integrated circuit supply node in order to supply power to the integrated circuit;
a corresponding plurality of individually controllable biasing arrangements for biasing respective pass transistors of the transistor arrangements, the biasing arrangement being configured to prevent voltage over-stress of the biased pass transistors,
wherein power to the integrated circuit is configured to be supplied via a voltage at the charging capacitor, and
wherein each level shifter of the plurality of controllable level shifters biases a pass transistor of a corresponding transistor arrangement of the plurality of individually selectively activatable transistor arrangements, the pass transistors of each transistor arrangement including a pass transistor directly connected to the internal integrated circuit supply node, the level shifter biasing said directly connected pass transistor by biasing a gate voltage of said directly connected pass transistor for an "ON" pass transistor path with a constrained voltage configured to ensure a conductive path to pass a logic high input control voltage without presenting an over-voltage condition and for an "OFF" pass transistor path with a constrained voltage configured to ensure the pass transistor does not conduct any current, and
wherein the level shifter is further configured to receive a set of control signals, the control signals all being based on a voltage level of an input control voltage, and further
wherein an output biasing voltage of the level shifter provided to the gate of the directly connected pass transistor is configured to be constrained between a voltage of a control signal and the voltage at the charging capacitor.

7. The integrated circuit of claim 6, wherein the output biasing voltage of the level shifter adjusts with changing values of the input control voltage.

8. A method for bootstrapping an internal chip supply, the method comprising:
providing an internal supply node configured to supply the internal chip supply;
providing a plurality of selectable input control voltages;
providing a plurality of transistor arrangements comprising stacked pass transistors each transistor arrangement configured to selectively pass a selectable input control voltage of the plurality of selectable input control voltages and connect said input control voltage to the internal supply node;
selecting an input control voltage;
based on the selecting, biasing the stacked pass transistors of the plurality of transistor arrangements;
based on the biasing, protecting the stacked pass transistors of the plurality of transistor arrangements from over-stressing;
based on the biasing, selecting a transistor arrangement and passing the input control voltage;

based on the passing, charging a capacitor connected to the internal supply node;

based on the charging, providing a supply voltage to the internal supply node; and based on the providing the supply voltage, bootstrapping the internal chip supply, wherein biasing further comprises providing a bias voltage to a gate of a last pass transistor of the stacked transistors connected to the internal supply node, said bias voltage being constrained to be between a voltage of an input control voltage and the supply voltage such that the bias voltage is in agreement with a varying input control voltage, and wherein biasing further comprises providing a bias voltage independent from the input control voltage to gates of each pass transistor of the stacked transistors not connected to the internal supply node.

9. An integrated circuit comprising:

an internal integrated circuit supply node;

a plurality of individually selectively activatable transistor arrangements inclusive of pass transistors for selectively passing respective input control voltages to the internal integrated circuit supply node in order to supply power to the integrated circuit; and a corresponding plurality of individually controllable biasing arrangements for biasing respective pass transistors of the transistor arrangements, the biasing arrangement being configured to prevent voltage over-stress of the biased pass transistors, comprising:

a plurality of controllable level shifters configured to operate from the supply power provided at the internal integrated circuit supply node, wherein:

each level shifter of the plurality of controllable level shifters biases a gate of a pass transistor of a corresponding transistor arrangement of the plurality of individually selectively activatable transistor arrangements directly connected to the internal integrated circuit supply node, the each level shifter biases the gate of the directly connected pass transistor for an "ON" pass transistor path with a constrained voltage configured to ensure a conductive path to pass a logic high input control voltage without presenting an over-voltage condition, the each level shifter biases the gate of the directly connected pass transistor for an "OFF" pass transistor path with a constrained voltage configured to ensure the pass transistor does not conduct any current, the each level shifter is further configured to receive a set of control signals, the control signals all being based on a voltage level of an input control voltage, and an output biasing voltage of the each level shifter provided to the gate of the directly connected pass transistor is configured to be constrained between a voltage of a control signal and a voltage at the internal integrated supply node.

10. The integrated circuit of claim 9, wherein the output biasing voltage of the each level shifter adjusts with changing values of the input control voltage.

\* \* \* \* \*